(12) United States Patent
Ding et al.

(10) Patent No.: US 8,587,049 B2
(45) Date of Patent: Nov. 19, 2013

(54) MEMORY CELL SYSTEM WITH CHARGE TRAP

(75) Inventors: Meng Ding, Sunnyvale, CA (US); Amol Ramesh Joshi, Sunnyvale, CA (US); Lei Xue, Sunnyvale, CA (US); Takashi Orimoto, Sunnyvale, CA (US); Kuo-Tung Chang, Saratoga, CA (US)

(73) Assignees: Spansion, LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 565 days.

(21) Appl. No.: 11/458,046

(22) Filed: Jul. 17, 2006

(65) Prior Publication Data
US 2008/0012060 A1   Jan. 17, 2008

(51) Int. Cl.
*H01L 29/76* (2006.01)

(52) U.S. Cl.
USPC ............................................. 257/314

(58) Field of Classification Search
USPC ............... 438/287, 288; 257/314, E21.209, 257/E21.21, E21.423, E21.679
See application file for complete search history.

(56) References Cited

U.S. PATENT DOCUMENTS

| | | | |
|---|---|---|---|
| 6,180,538 B1 * | 1/2001 | Halliyal et al. | 438/769 |
| 6,339,000 B1 * | 1/2002 | Bhattacharya et al. | 438/261 |
| 6,436,768 B1 | 8/2002 | Yang et al. | |
| 6,445,030 B1 | 9/2002 | Wu et al. | |
| 6,709,928 B1 | 3/2004 | Jenne et al. | |
| 6,750,157 B1 * | 6/2004 | Fastow et al. | 438/786 |
| 6,828,201 B1 | 12/2004 | Ramkumar | |
| 6,949,789 B2 | 9/2005 | Weimer et al. | |
| 7,042,045 B2 | 5/2006 | Kang et al. | |
| 7,042,767 B2 | 5/2006 | Wang et al. | |
| 7,045,854 B2 | 5/2006 | Osabe et al. | |
| 2002/0063277 A1 | 5/2002 | Ramsbey et al. | |
| 2004/0251521 A1 | 12/2004 | Tanaka et al. | |
| 2005/0012141 A1 * | 1/2005 | Bhattacharyya | 257/318 |
| 2005/0253189 A1 * | 11/2005 | Cho et al. | 257/330 |

OTHER PUBLICATIONS

S. Jeon, J. H. Han, J. H. Lee, S. Choi, H. Hwang, and C. Kim "High Work-function Metal Gate and High-k Dielectrics for Charge Trap Flash Memory Device Applications," IEEE Transactions on Electronic Devices. vol. 52, No. 12, pp. 2654-2659, Dec. 2005.*

* cited by examiner

*Primary Examiner* — Walter H Swanson
(74) *Attorney, Agent, or Firm* — Farjami & Farjami LLP

(57) ABSTRACT

A memory cell system is provided forming a first insulator layer over a semiconductor substrate, forming a charge trap layer over the first insulator layer, forming an intermediate layer over the charge trap layer, and forming a second insulator layer with the intermediate layer.

10 Claims, 4 Drawing Sheets

MEMORY CELL SYSTEM WITH CHARGE TRAP

CROSS-REFERENCE TO RELATED APPLICATIONS

This application claims the benefit of U.S. patent application Ser. No. 11/277,008 filed Mar. 20, 2006.

This application contains subject matter related to a co-pending U.S. Patent Application by Meng Ding, Robert B. Ogle, Jr., Chi Chang, Lei Xue, and Mark Randolph entitled "Memory Cell System Using Silicon-Rich Nitride". The related application is assigned to Spansion LLC and Advanced Micro Devices, Inc.

TECHNICAL FIELD

The present invention relates generally to a memory system and more particularly to a non-volatile memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

Various types of non-volatile memories have been developed including electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become popular because it combines the advantages of the high density and low cost of EPROM with the electrical erasability of EEPROM. Flash memory can be rewritten and can hold its contents without power. Contemporary Flash memories are designed in a floating gate or a charge trapping architecture. Each architecture has its advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture which results in decrease in data retention.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. Leakage and charge-trapping efficiency are two major parameters considered in device performance evaluation. Charge-trapping efficiency determines if the memory devices can keep enough charges in the storage nodes after program/erase operation and is reflected in retention characteristics. It is especially critical when the leakage behavior of storage devices is inevitable. Silicon content in the nitride layer improves the programming and erasing performances but offers poor data retention. Although silicon content plays an important role in charge-trapping efficiency, it does not have same constructive effect on leakage characteristics.

Thus, a need still remains for a memory cell system providing low cost manufacturing, improved yields, improved programming performance, and improved data retention of memory in a system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a memory cell system including forming a first insulator layer over a semiconductor substrate, forming a charge trap layer over the first insulator layer, forming an intermediate layer over the charge trap layer, and forming a second insulator layer with the intermediate layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
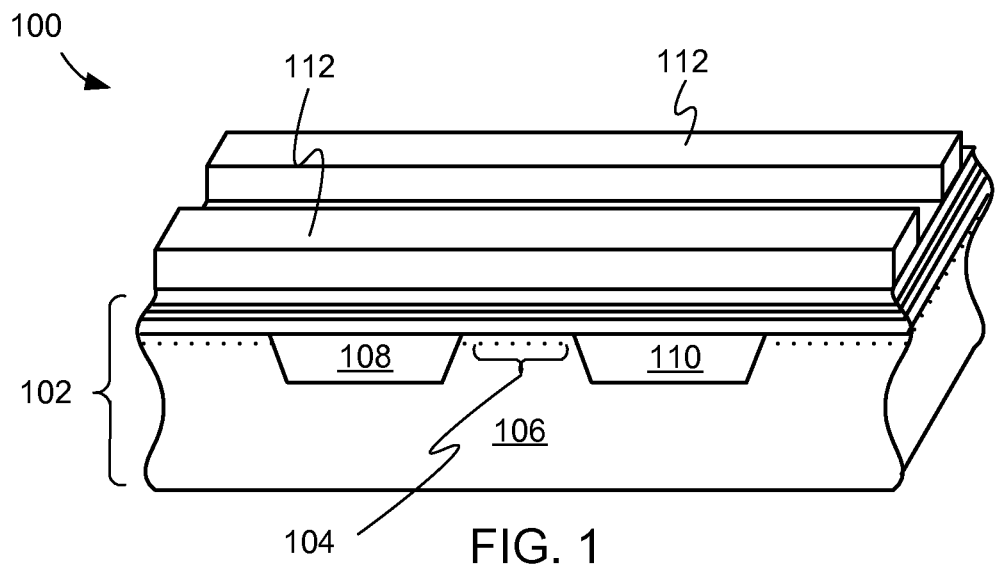
FIG. 1 is a cross-sectional isometric view of a memory cell system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional isometric view of a memory cell system 100 in an embodiment of the present invention. The memory cell system 100 may be used in a number of different memory architectures, such as NOR or NAND architecture. The memory cell system 100 includes a memory cell stack 102 including a charge storage region 104 for storing an electrical charge, such as electrons. For illustrative purposes, the memory cell system 100 is shown having one of the charge storage region 104 for storing electrical charges, although it is understood that any number of the charge storage regions maybe provided, as well. It is also understood that the charge storage region 104 may provide storage for any number of electrical charges.

The memory cell stack 102 also includes a semiconductor substrate 106, such as a p-type substrate, having a first region 108, such as an n-type region, and a second region 110, such as an n-type region. The first region 108 may be a source and the second region 110 may be the drain or vice versa. Depending on the overall memory array connection with the memory cell system 100, the first region 108, the second region 110, or both may connect to bit lines providing access in to the memory cell system 100 for decoding processes, such as reading, programming and erasing. The memory cell system 100 also includes word lines 112, such as polysilicon, n-type polysilicon, or metal, acting as control gates in cooperation with the bit lines for the decoding processes, such as reading, programming and erasing. Depending upon a signal on the word lines 112 and the connection of the bit lines to an electrical source or drain, the memory cell system 100 may read, program or erase the charge storage region 104.

Figure 2:
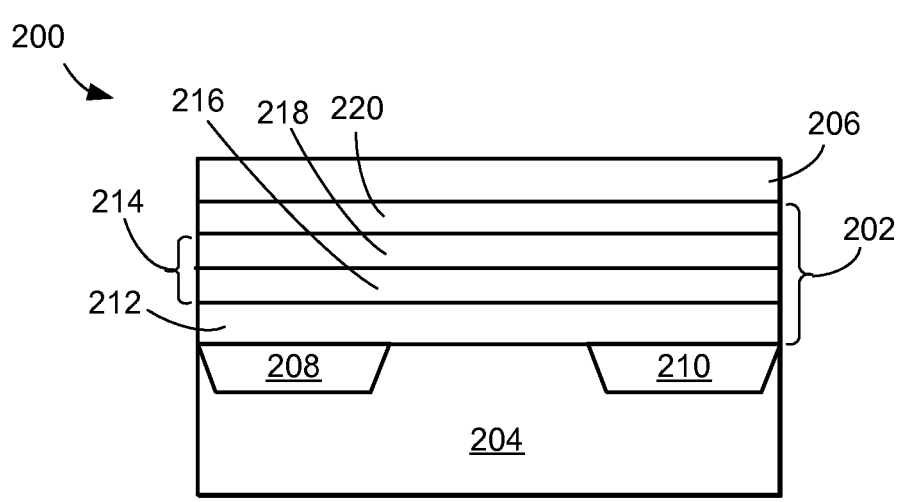
FIG. 2 is a more detailed cross-sectional view of a memory cell stack in an embodiment of the present invention.

Referring now to FIG. 2, therein is shown a cross-sectional view of a memory cell stack 200 in an embodiment of the present invention. The memory cell stack 200 may represent the memory cell stack 102 of FIG. 1. The memory cell stack 200 includes a charge-storage stack 202 on a semiconductor substrate 204, such as a p-type silicon substrate. A semiconductor gate 206, such as a polysilicon, n-type polysilicon, or metal gate, is on the charge-storage stack 202.

The charge-storage stack 202 provides a region between a first region 208, such as an n-type region, and a second region 210, such as an n-type region, for storage of electrical charges. The semiconductor substrate 204 and the semiconductor gate 206 provide access for reading and erasing storage locations of the electrical charges.

The charge-storage stack 202 has multiple layers. A first insulator layer 212, such as a dielectric layer of silicon dioxide ($SiO_2$), of the charge-storage stack 202 is over the semiconductor substrate 204. A charge-storage bi-layer 214 of the charge-storage stack 202 is on the first insulator layer 212. The charge-storage bi-layer 214 provides regions for storage of the electrical charges. The charge-storage bi-layer 214 includes a charge trap layer 216, such as a silicon rich nitride (SRN or SiRN) layer of silicon nitride ($Si_XN_Y$), and an intermediate layer 218, such as a regular silicon nitride (SiN) layer or a nitride layer. A second insulator layer 220, such as a dielectric layer of silicon dioxide ($SiO_2$), of the charge-storage stack 202 is on the charge-storage bi-layer 214.

For illustrative purposes, the charge-storage bi-layer 214 is shown as having two layers although it is understood that the number layers may differ. Also for illustrative purpose, the layers in the charge-storage bi-layer 214 is shown as stratified, although it is understood that the layers may not he stratified but form a gradient of similar material with difference concentrations, such as silicon concentration difference from bottom to the top of the charge-storage bi-layer 214. Further for illustrative purposes, the intermediate layer 218 is described as between the second insulator layer 220 and the charge trap layer 216, although it is understood that the intermediate layer 218 may also provide charge trap sites.

For the memory cell system 100 of FIG. 1, leakage and charge-trapping efficiency are two major parameters considered in memory system (not shown) performance evaluation. Charge-trapping efficiency determines if the memory devices can keep enough charges in the charge-storage bi-layer 214 after program/erase operation and is reflected in retention characteristics.

The charge-trapping efficiency is proportional to relative silicon content ratio in nitride layer. The increased silicon content improves electron mobility in the charge trap layer 216. Although silicon content plays an important role in charge-trapping efficiency, it does not have the same constructive effect on leakage characteristics. Gate oxide scaling in new semiconductor processes reduces the thickness of the gate oxide to increase the direct tunneling current leading to excessive gate leakage when charge is stored in the charge-storage bi-layer 214.

It has been discovered that the charge-storage bi-layer 214 improves the erase and programming performance, by approximately three or more orders of magnitude, while increasing data retention compared to silicon rich nitride or nitride alone. The charge-storage bi-layer 214 is comprised of the regular silicon nitride layer, such as the intermediate layer 218, next to the top blocking oxide layer, such as the first insulator layer 212. The charge-storage bi-layer 214 also includes the silicon-rich nitride layer, such as the charge trap layer 216, next to the bottom tunneling layer, such as the second insulator layer 220. The aim of the top blocking oxide layer is not only to inhibit gate injection, but also to block the charges injected from the silicon at the top oxide-nitride interface. The large oxygen-related electron trap densities are obtained at the nitride-top oxide interface due to the oxidation of the nitride. This results in a larger memory window in spite of the decreased nitride thickness. For a constant top blocking oxide layer thickness, this would eventually make the threshold of the written state independent of the nitride thickness. If pinholes are present in the thinner nitride layer, they can be filled with oxide during oxidation. The retention behavior is improved.

Figure 3:
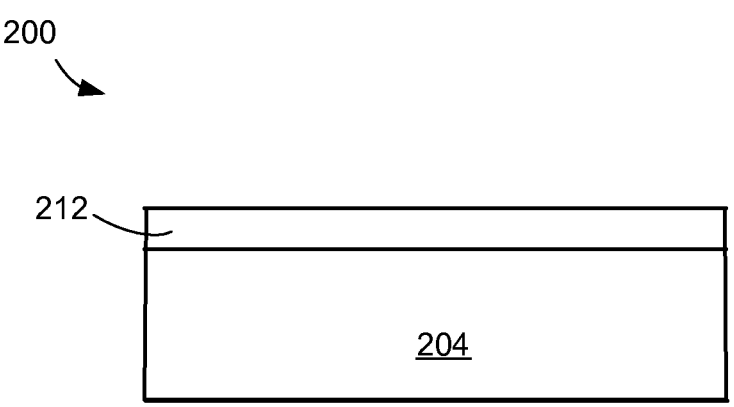
FIG. 3 is a more detailed cross-sectional view of the memory cell stack of FIG. 2 in a formation phase of the first insulator layer.

Referring now to FIG. 3, therein is shown a more detailed cross-sectional view of the memory cell stack 200 of FIG. 2 in a formation phase of the first insulator layer 212. This more detailed cross-sectional view depicts the memory cell stack 200 between the first region 208 of FIG. 2 and the second region 210 of FIG. 2. The first insulator layer 212 is formed on the semiconductor substrate 204. The first insulator layer 212 may be formed by any number of processes, such as thermal oxidation.

Figure 4:
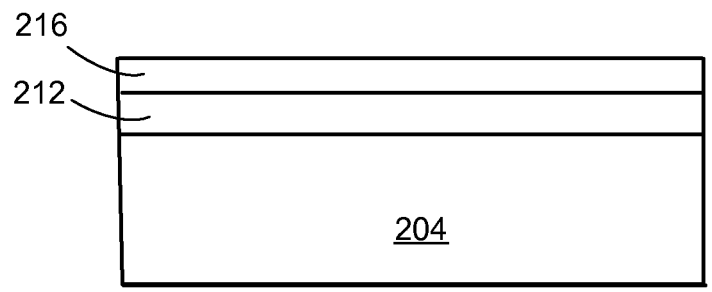
FIG. 4 is a cross-sectional view of the structure of FIG. 3 in a formation phase of the charge trap layer.

Referring now to FIG. 4, therein is shown a cross-sectional view of the structure of FIG. 3 in a formation phase of the charge trap layer 216. The silicon rich nitride (SiRN) of the charge trap layer 216 is deposited on the first insulator layer 212 and over the semiconductor substrate 204.

The silicon-rich nitride may be formed by a chemical vapor deposition process (CVD) wherein two types of gases, such as $NH_3$ and $SiH_4$, interact during the deposition of the silicon-rich nitride. A ratio of the gases, such as $NH_3:SiH_4$, is below approximately 360:60, but higher than approximately 53:330, to be considered silicon-rich nitride. The silicon-rich nitride may include a higher ratio, such as 28:360, to provide conductivity for single bit storage.

Figure 5:
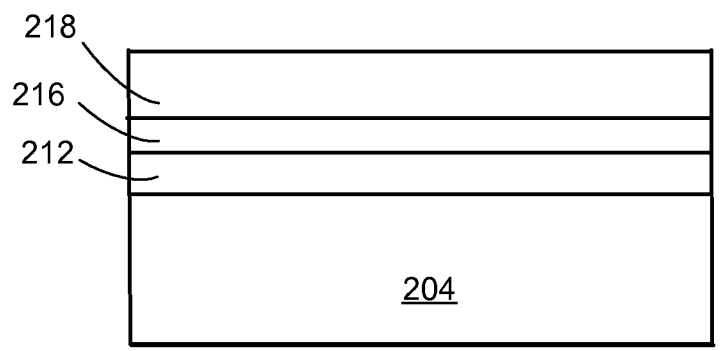
FIG. 5 is a cross-sectional view of the structure of FIG. 4 in a formation phase of the intermediate layer.

Referring now to FIG. 5, therein is shown a cross-sectional view of the structure of FIG. 4 in a formation phase of the intermediate layer 218. The intermediate layer 218 may be either a nitride layer or a regular silicon nitride (SiN) layer. In either case, the intermediate layer 218 may be deposited on the charge trap layer 216 with a chemical vapor deposition process (CVD), as an example, and over the semiconductor substrate 204.

Figure 6:
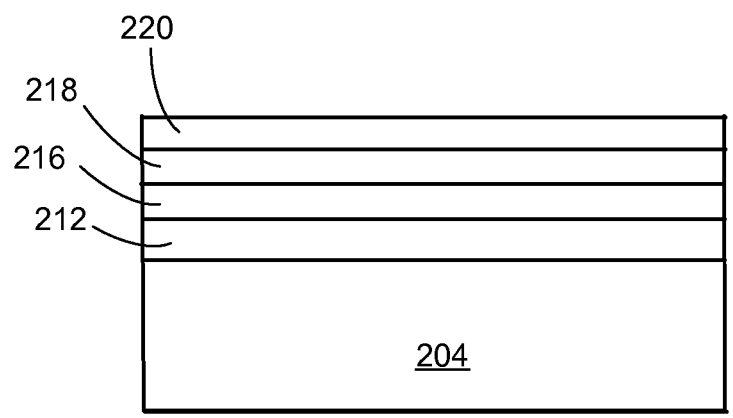
FIG. 6 is a cross-sectional view of the structure of FIG. 5 in a formation phase of the second insulator layer.

Referring now to FIG. 6, therein is shown a cross-sectional view of the structure of FIG. 5 in a formation phase of the second insulator layer 220. The intermediate layer 218 from FIG. 5 undergoes thermal oxidation, such as steam oxidation, to form the second insulator layer 220, as the top blocking oxide layer, from the upper portion of the silicon rich nitride or regular silicon nitride layer from FIG. 5. In cases of the silicon rich nitride, it is less silicon rich than the charge trap layer 216.

This oxide formed by steam oxidation of the nitride is at the expense of the nitride thickness of the intermediate layer 218. Any pinholes present in the silicon rich nitride/regular silicon nitride layer can be filled with oxide during oxidation of the nitride. The steam oxidation process forms a better interface between the second insulator layer 220 and the intermediate layer 218 improving the quality and reliability of the memory cell stack 200 of FIG. 2. The resultant thickness of the charge trap layer 216 is in the range of 30 to 80 angstrom and the intermediate layer 218 is in the range of 0 to 60 angstrom both over the semiconductor substrate 204. The steam oxidation oxidizes the intermediate layer 218 such that the steam oxidation process may oxidize the entire thickness of the intermediate layer 218. The structure of the intermediate layer 218 remains but with a different composition resulting from the steam oxidation.

Figure 7:
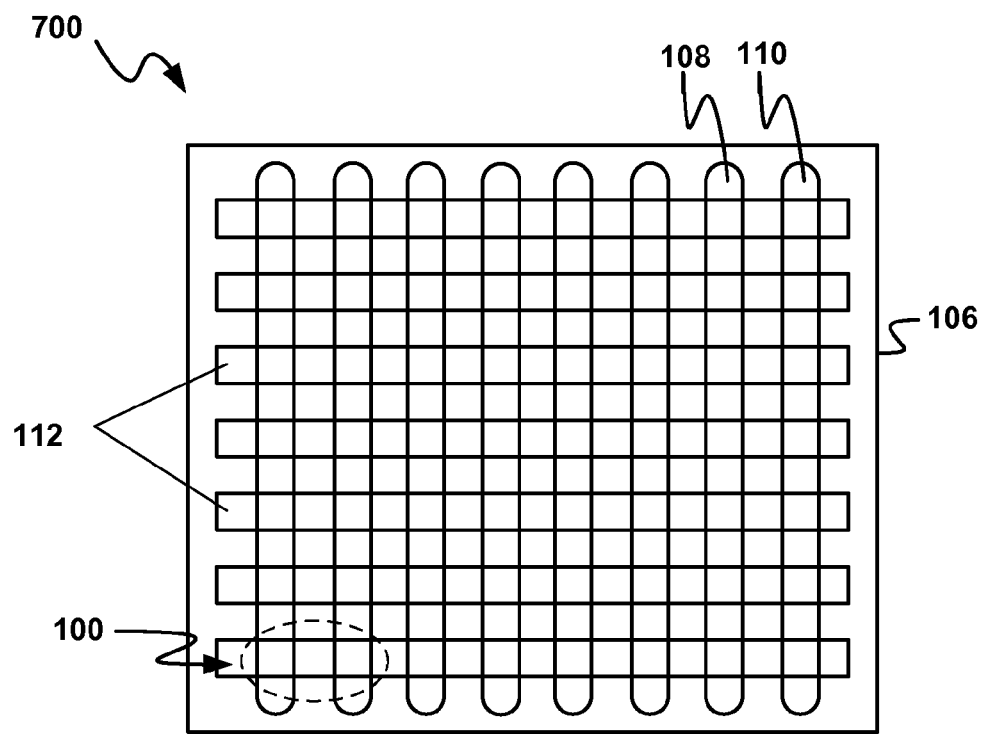
FIG. 7 is a plan view of a portion of a memory array system in an embodiment of the present invention.

Referring now to FIG. 7, therein is shown a plan view of a portion of a memory system 700 in an embodiment of the present invention. The memory system 700 is an M×N array of memory cell systems 100. The semiconductor substrate 106 has a plurality of first regions 108 and second regions 110 as implanted bit lines extending in parallel with a plurality of the word lines 112 extending in parallel and at right angles to the plurality of implanted bit lines. The word lines 112 and bit lines have contacts and interconnections (not shown) to the programming circuitry to be discussed further in FIG. 8.

Figure 8:
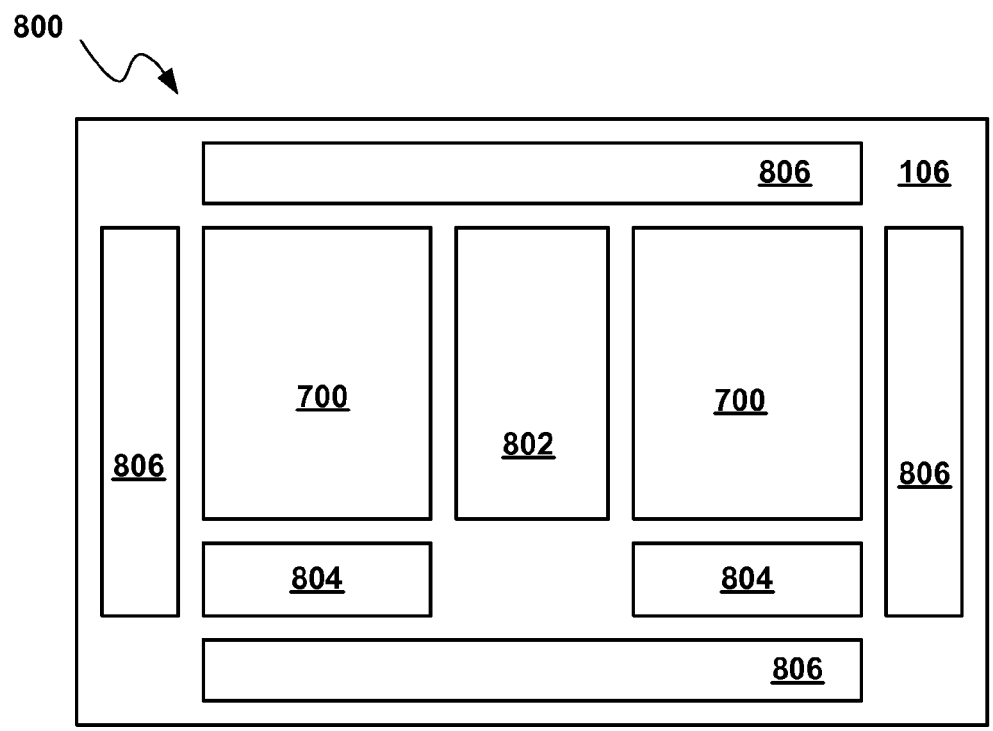
FIG. 8 is a plan view of a device in an embodiment of the present invention.

Referring now to FIG. 8, therein is shown a plan view of a device 800 in an embodiment of the present invention. The device 800 is a semiconductor device including the memory system 700 as well as the memory cell system 100. The device 800 commonly includes the semiconductor substrate 106 in which one or more high-density core regions and one or more low-density peripheral portions are formed.

High-density core regions typically include one or more memory systems 700 of individually addressable, substantially identical memory cell systems 100 of FIG. 1. Low-density peripheral portions typically include input/output (I/O) circuitry and programming circuitry for individually and selectively addressing the memory cell system 100 of FIG. 1. The programming circuitry is represented in part by and includes one or more x-decoders 802 and y-decoders 804, cooperating with I/O circuitry 806 for connecting the source, gate, and drain of selected addressed memory cells to predetermined voltages or impedances to effect designated operations on the memory cell, e.g., programming, reading, and erasing, and deriving necessary voltages to effect such operations.

For illustrative purposes, the device 800 is shown as a memory device, although it is understood that the device 800 may other semiconductor devices having other functional blocks, such as a digital logic block, a processor, or other types of memories. Also for illustrative purposes, the device 800 is described as a single type of semiconductor device, although it is understood that the device 800 may be a multichip module utilizing the present invention with other types of devices of similar or different semiconductor technologies, such as power devices or microelectromechanical systems (MEMS). Further for illustrative purposes, the device 800 is described as a semiconductor device, although it is understood that the device 800 may be a board level product including the present invention.

Figure 9:
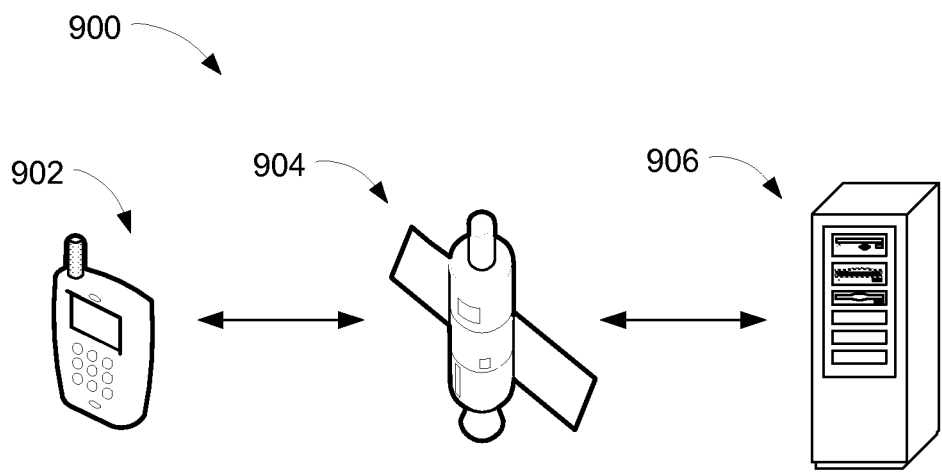
FIG. 9 are electronics systems in an embodiment of the present invention.

Referring now to FIG. 9, therein is shown electronic systems 900 in an embodiment of the present invention. A smart phone 902, a satellite 904, and a compute system 906 are examples of the electronic systems 900 using the present invention. The electronic systems 900 may be any system that performs any function for the creation, transportation, storage, and consumption of information. For example, the smart phone 902 may create information by transmitting voice to the satellite 904. The satellite 904 is used to transport the information to the compute system 906. The compute system 906 may be used to store the information. The smart phone 902 may also consume information sent from the satellite 904.

Figure 10:
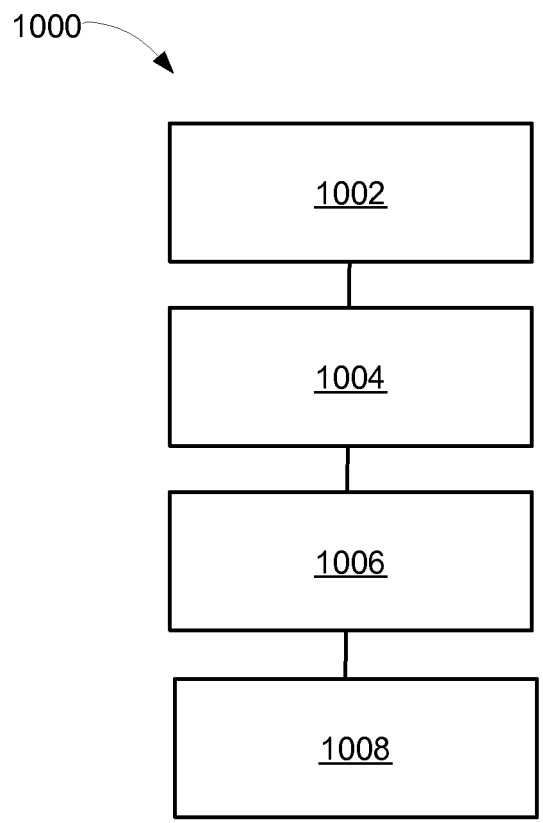
FIG. 10 is a flow chart of a system for a memory cell in an embodiment of the present invention.

Referring now to FIG. 10, therein is shown a flow chart of a system 1000 for a memory cell system 100 in an embodiment of the present invention. The system 1000 includes forming a first insulator layer over a semiconductor substrate in a block 1002; forming a charge trap layer over the first insulator layer in a block 1004; forming an intermediate layer over the charge trap layer in a block 1006; and forming a second insulator layer with the intermediate layer in a block 1008.

It has been discovered that the present invention thus has numerous aspects.

It has been discovered that the bi-layer comprised of the regular silicon nitride layer next to the top blocking oxide layer and the silicon-rich nitride layer next to the bottom tunneling layer improves the erase and programming performance, by more orders of magnitude compared to regular nitride, while increasing data retention compared to silicon rich nitride or regular nitride alone. The present invention may be used in a number of different memory architectures, such as NOR or NAND architectures.

An aspect of the present invention is that the bi-layer of an intermediate layer next to the top blocking oxide layer and the silicon-rich nitride layer between the intermediate layer and the bottom tunneling oxide layer improves the erase and programming performance approximately three or more orders of magnitude compared to regular silicon nitride alone.

Another aspect of the present invention is that the top blocking oxide layer along with the intermediate layer inhibit gate injection and block the charges injected from the silicon at the top oxide-nitride interface, resulting in faster and deeper erase.

Yet another aspect of the present invention is that the steamed oxidation process of the intermediate layer to form the top blocking oxide layer provides large oxygen-related electron trap densities obtained at the nitride-top oxide interface due to the oxidation of the nitride. This results in a larger memory window in spite of the decreased nitride thickness. If pinholes are present in the intermediate layer, they can be filled with oxide during oxidation of the nitride. The retention and degradation behavior are improved.

Yet another aspect of the present invention is that the intermediate layer protects the charge trap sites in the silicon rich layer from steam oxidation process.

Yet another aspect of the present invention is that the charge trap layer may tune the silicon content to balance erase and program performance with the data retention.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the memory cell system method and apparatus of the present invention furnish important and heretofore unknown and unavailable solutions, capabilities, and functional aspects for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A memory cell manufacturing method comprising:
    forming a first insulator layer over a semiconductor substrate;
    forming a charge trap layer over the first insulator layer;
    forming an intermediate layer over the charge trap layer; and
    forming a second insulator layer from an upper portion of the intermediate layer;
    wherein the charge trap layer comprises a first material and the intermediate layer comprises a second material, wherein the first material is situated adjacent to the first insulator layer and the second material is situated adjacent to the second insulator layer so as to cause a charge-storage bi-layer formed by the charge trap layer and the intermediate layer to have increased data retention.

2. The manufacturing method as claimed in claim 1 wherein forming the charge trap layer includes forming a silicon rich nitride.

3. The manufacturing method as claimed in claim 1 wherein forming the intermediate layer includes forming a stoichiometric silicon nitride.

4. The manufacturing method as claimed in claim 1 wherein forming the second insulator layer includes steam oxidizing the upper portion of the intermediate layer.

5. The manufacturing method as claimed in claim 1 further comprising:
    forming a memory system with memory cell systems; and
    forming a device or an electronic system with the memory system.

6. A memory cell manufacturing method comprising:
    forming a first dielectric layer over a semiconductor substrate;
    forming a silicon rich nitride layer over the first dielectric layer;
    forming an intermediate layer with a nitride over the silicon rich nitride layer; and
    forming a second dielectric layer by steam oxidizing the intermediate layer;
    wherein the silicon rich nitride layer is situated adjacent to the first dielectric layer and the nitride in the intermediate layer is situated adjacent to the second dielectric layer so as to cause a charge-storage bi-layer formed by the silicon rich nitride layer and the intermediate layer to have increased data retention.

7. The manufacturing method as claimed in claim 6 wherein forming the second dielectric layer by steam oxidizing the intermediate layer includes filling a pinhole in the intermediate layer.

8. The manufacturing method as claimed in claim 6 wherein forming the second dielectric layer by steam oxidizing the intermediate layer includes oxidizing the entire thickness of the intermediate layer.

9. The manufacturing method as claimed in claim 6 wherein forming the intermediate layer includes forming a gradient concentration of the silicon rich nitride layer.

10. The manufacturing method as claimed in claim 6 further comprising connecting a gate contact over the second dielectric layer.

* * * * *